(12) United States Patent
Aigner et al.

(10) Patent No.: US 6,839,962 B2
(45) Date of Patent: Jan. 11, 2005

(54) METHOD OF PRODUCING MICROMECHANICAL STRUCTURES

(75) Inventors: Robert Aigner, München (DE); Florian Plötz, München (DE); Sven Michaelis, München (DE); Michael Brauer, München (DE)

(73) Assignee: Infineon Technologies AG, Munich (DE)

(*) Notice: Subject to any disclaimer, the term of this patent is extended or adjusted under 35 U.S.C. 154(b) by 280 days.

(21) Appl. No.: 10/178,253

(22) Filed: Jun. 24, 2002

(65) Prior Publication Data
US 2002/0170175 A1 Nov. 21, 2002

Related U.S. Application Data

(63) Continuation of application No. PCT/EP00/12672, filed on Dec. 13, 2000.

(30) Foreign Application Priority Data

Dec. 22, 1999 (DE) .......................................... 199 62 231

(51) Int. Cl.[7] ............................. H05K 3/02; H05K 3/10
(52) U.S. Cl. ....................... 29/846; 29/425; 174/250; 361/748; 83/51; 83/861; 83/929.1; 83/929.2
(58) Field of Search .................. 29/846, 425; 174/250; 361/748; 83/51, 861, 929.1, 929.2

(56) References Cited

U.S. PATENT DOCUMENTS

| | | | | |
|---|---|---|---|---|
| 2,941,560 A | * | 6/1960 | McCaffery | 83/882 |
| 3,466,743 A | * | 9/1969 | Puy | 29/602.1 |
| 3,614,968 A | * | 10/1971 | Hirz | 144/178 |
| 3,656,378 A | * | 4/1972 | Davis | 83/861 |
| 3,731,243 A | * | 5/1973 | Davis | 336/61 |
| 3,999,290 A | * | 12/1976 | Wood | 30/2 |
| 4,338,149 A | * | 7/1982 | Quaschner | 156/248 |

(List continued on next page.)

FOREIGN PATENT DOCUMENTS

| | | |
|---|---|---|
| DE | 196 19 921 A1 | 12/1996 |
| EP | 0 828 346 A2 | 3/1998 |
| JP | 2-14547 A | 1/1990 |
| JP | 09 223 678 A | 8/1997 |
| JP | 10 154 668 A | 6/1998 |

OTHER PUBLICATIONS

Martin A. Schmidt:: "Wafer–to–Wafer Bonding for Microstructure Formation", *Proceedings of the IEEE, vol. 86, No. 8, Aug. 1998, pp. 1575–1585.*

Sven Michaelis et al.: "Acceleration Threshold Switches from an Additive Electroplating MEMS Process", *Eurosensors XIII, The 13th European Conference on Solid–State Transducers, Sep. 12–15, 1999, The Hague, The Netherlands, Section 24B1, Inertial sensors, pp. 785–788.*

M. Wycisk et aL.: "Low Cost Post–CMOS Integration of Electrolated Microstructures For Inertial Sensing", *Siemens Semiconductors, Munich, Germany.*

Michael Wycisk et al.: "New sensor on–chip technology for micromechanical acceleration–threshold switches", *Wireless Product Sensors, Munich, Germany.*

Sven Michaelis et al.: "Additive Electroplating Technology as a Post–CMOS Process for the Production of MEMS Accelaration–Threshold Switches for Transportation Applications", *IMSAS, University of Bremen, Bremen, Germany.*

Primary Examiner—Richard Kiltae Chang
(74) Attorney, Agent, or Firm—Laurence A. Greenberg; Werner H. Stemer; Gregory L. Mayback

(57) ABSTRACT

A micromechanical structure is described which is disposed on a base body and requires protection from environmental influences by a covering body. Furthermore, electrical contacts are necessary for establishing contacts for the micromechanical structure. By skillfully carrying out a sawing-into operation and a sawing-through operation, it is possible to expose the electrical contact.

14 Claims, 6 Drawing Sheets

U.S. PATENT DOCUMENTS

| | | | | |
|---|---|---|---|---|
| 4,532,839 A | * | 8/1985 | Easton | 83/29 |
| 4,567,545 A | * | 1/1986 | Mettler, Jr. | 361/764 |
| 4,621,552 A | * | 11/1986 | Lopez | 83/27 |
| 4,846,032 A | * | 7/1989 | Jampathom et al. | 83/51 |
| 4,931,134 A | * | 6/1990 | Hatkevitz et al. | 216/17 |
| 5,004,639 A | * | 4/1991 | Desai | 428/138 |
| 5,061,988 A | * | 10/1991 | Rector | 257/689 |
| 5,253,415 A | * | 10/1993 | Dennis | 29/827 |
| 5,435,876 A | * | 7/1995 | Alfaro et al. | 156/247 |
| 5,499,444 A | * | 3/1996 | Doane et al. | 29/830 |
| 5,622,588 A | * | 4/1997 | Weber | 156/263 |
| 5,638,597 A | * | 6/1997 | Cutting et al. | 29/830 |
| 5,668,033 A | | 9/1997 | Ohara et al. | |
| 5,729,437 A | * | 3/1998 | Hashimoto | 361/760 |
| 5,773,764 A | * | 6/1998 | von Vajna | 174/250 |
| 5,798,014 A | * | 8/1998 | Weber | 156/263 |
| 5,819,388 A | * | 10/1998 | Salm | 29/424 |
| 5,831,218 A | * | 11/1998 | Hu et al. | 174/250 |
| 5,834,084 A | * | 11/1998 | Maggio | 428/64.1 |
| 5,923,995 A | | 7/1999 | Kao et al. | |
| 5,966,052 A | * | 10/1999 | Sakai | 331/68 |
| 6,007,470 A | * | 12/1999 | Komarek et al. | 493/397 |
| 6,007,886 A | * | 12/1999 | Takigami | 428/43 |
| 6,054,338 A | * | 4/2000 | Lee et al. | 438/110 |
| 6,057,175 A | * | 5/2000 | Milla et al. | 438/113 |
| 6,136,681 A | * | 10/2000 | Razon et al. | 438/617 |
| 6,239,380 B1 | * | 5/2001 | Drussel et al. | 174/250 |
| 6,271,102 B1 | * | 8/2001 | Brouillette et al. | 438/462 |
| 6,326,240 B1 | * | 12/2001 | Liaw | 438/113 |
| 6,359,235 B1 | * | 3/2002 | Hayashi | 174/260 |
| 6,383,835 B1 | * | 5/2002 | Hata et al. | 438/65 |
| 6,407,333 B1 | * | 6/2002 | Schroen | 174/52.4 |
| 6,438,829 B1 | * | 8/2002 | Haake | 29/874 |
| 6,475,878 B1 | * | 11/2002 | Slepcevic | 438/460 |
| 6,534,726 B1 | * | 3/2003 | Okada et al. | 174/263 |
| 6,586,677 B2 | * | 7/2003 | Glenn | 174/52.2 |
| 6,624,921 B1 | * | 9/2003 | Glenn et al. | 359/291 |
| 6,687,970 B2 | * | 2/2004 | Waechter et al. | 29/426.4 |
| 6,694,852 B1 | * | 2/2004 | Ours et al. | 83/861 |
| 6,710,246 B1 | * | 3/2004 | Mostafazadeh et al. | 174/52.3 |
| 6,722,030 B1 | * | 4/2004 | Stelzl et al. | 29/841 |
| 6,724,083 B2 | * | 4/2004 | Ohuchi et al. | 257/734 |
| 6,751,085 B1 | * | 6/2004 | Huntington | 361/523 |

* cited by examiner

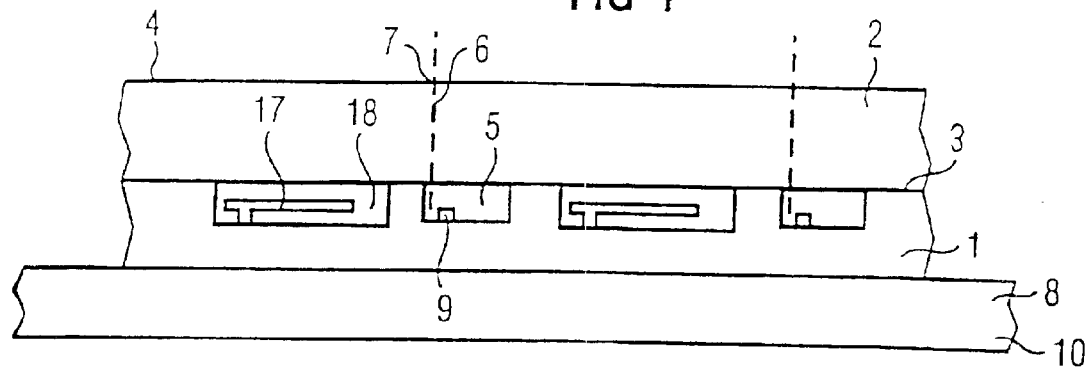
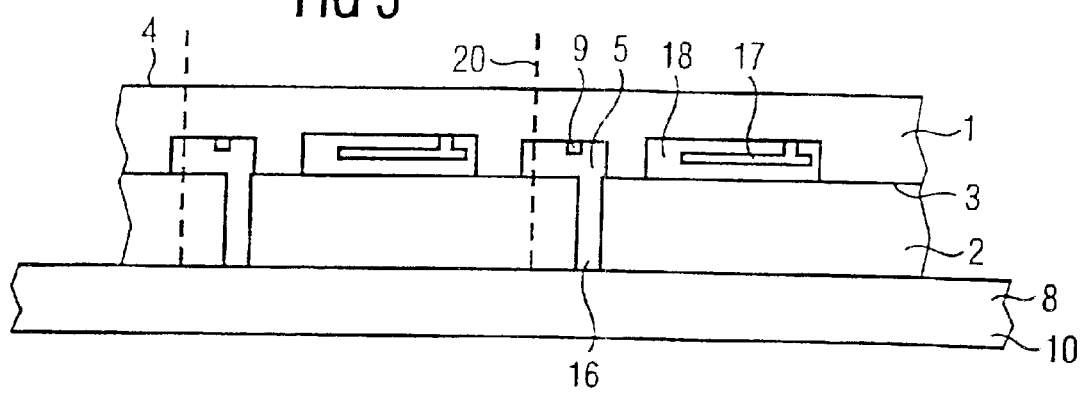
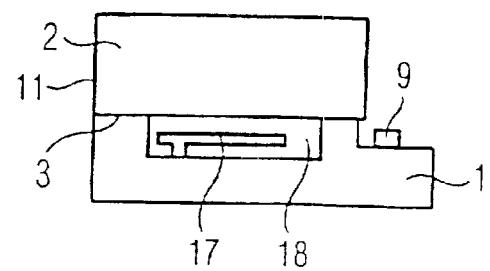

METHOD OF PRODUCING MICROMECHANICAL STRUCTURES

CROSS-REFERENCE TO RELATED APPLICATION

This application is a continuation of copending International Application No. PCT/EP00/12672, filed Dec. 13, 2000, which designated the United States and was not published in English.

BACKGROUND OF THE INVENTION

Field of the Invention

The present invention relates to a method of producing micromechanical structures that are formed on a base body and are protected from damage by a covering body.

Micromechanical structures are used, for example, as acceleration sensors for triggering airbags. The micromechanical structures in this case contain self-supporting parts, such as diaphragms or spring beams or the like, which bend when exposed to acceleration. On the basis of the bending, a value for the acceleration is determined.

Micromechanical structures are disposed, for example, on the surface of a base body and are protected from environmental influences, such as mechanical or chemical destruction, by a covering body.

Methods of producing micromechanical structures are specified, for example, in references by Sven Michaelis and Hans-Jörg Timme, titled "Acceleration Threshold Switches from an Additive Electroplating MEMS Process", Eurosensors XIII, The 13th European Conference on Solid State Transducers, Sep. 12–15, 1999, The Hague, The Netherlands; by M. Wycisk, T. Tönnesen and J. Binder, S. Michaelis and H. J. Timme, titled "Low Cost Post-CMOS Integration of Electroplated Microstructures for Inertial Sensing", and by M. Wycisk and J. Binder, S. Michaelis and H. J. Timme, titled "New Sensor On-Chip Technology for Micromechanical Acceleration Threshold Switches".

A method of covering micromechanical structures is described, for example, in a reference by Sven Michaelis, Hans-Jörg Timme, Michael Wycisk, Josef Binder, titled "Additive Electroplating Technology as a Post-CMOS Process for the Production of MEMS-Acceleration Threshold Switches for Transportation Applications". Used in this case is a specially prepared covering body with cavities on its underside, in which the micromechanical structures that are disposed on the base body are protected. Also disposed in the covering body are through-holes, in which the contact pads of the base body are accessible after the base body and the covering body have been joined together. If the holes were not present, it would not be possible for electrical contacts to be established for the structure.

The holes in the covering body make it liable to break and susceptible to cracks. This in turn leads to low yields and high costs. In addition, the production of the holes is a laborious etching process which takes over six hours and is therefore costly.

A further method of covering micromechanical structures and exposing the contact pads is to use sawing methods, in which large pieces of the covering body are sawn out and swept away in the flushing operation accompanying sawing. The sweeping-away of the large pieces entails a high risk of damage to the structures and also leads to breakages of the saw blade.

SUMMARY OF THE INVENTION

It is accordingly an object of the invention to provide a method of producing micromechanical structures that overcomes the above-mentioned disadvantages of the prior art methods of this general type, by which a base body and a covering body are joined together at their surfaces and at least part of the joined-together surface of the base body is exposed in a simple way.

Furthermore, the time for producing the cover is significantly reduced, since it is not necessary to etch any throughholes, which would usually take six hours. In addition, the etching of the holes entails the disadvantage that defects in the resist mask or cracks in the silicon wafer constituting the cover are greatly increased by the long etching time. This leads to a low yield of covers produced according to the prior art.

With the foregoing and other objects in view there is provided, in accordance with the invention, a method of producing a micromechanical structure. The method includes joining a base body to a covering body along a common boundary surface to form a composite body having a cavity formed in the composite body along the common boundary surface. The composite body is disposed with a surface of the base body on a support for a sawing of the covering body. An opening to the cavity is formed by removing material in a region of one surface of the composite body. The composite body is disposed with a surface of the covering body on the support for a sawing of the base body.

A further advantage of the method according to the invention is the possibility of using an unstructured cover and disposing the micromechanical structures in depressions on the base body. The method allows the covers to be formed very inexpensively.

A further advantage of the method according to the invention is that the covers can be formed from plastic.

Furthermore, the method according to the invention makes it possible only to form in the covering body depressions in which the micromechanical structures are received when the base body and the covering body are joined together.

In an advantageous refinement of the method according to the invention, the cavity is opened by the material in the region of one surface of the composite body being sawn into at least partially with a circular saw. It is possible as a result to use for the method according to the invention the methods used nowadays for the sawing-up of wafers into individual chips. This has the advantage that no extra expenditure on apparatus is necessary for the method according to the invention.

Furthermore, it is advantageous to dispose the composite body with a surface of the base body on a support for the sawing of the covering body. The support is usually a film onto which the base body is laminated. It is possible by the method and the configuration to saw only into the covering body, while the base body is fixed on the support.

A further advantageous method provides for the composite body to be disposed with a surface of the covering body on a support for the sawing of the base body. In the case of the method, the composite body can be laminated onto a film with the aid of the covering body and, in the subsequent sawing process, either the base body alone, or else, with a deeper depth of cut, both the base body and the covering body, can be sawn through. In the prior art, it is customary to laminate wafers onto a film and cut them up with a circular saw, with only the wafer being sawn up and the film remaining intact. This method can also be used for the method according to the invention.

In a further advantageous refinement of the method according to the invention, an electrical contact formed in the cavity is at least partially exposed. By this procedure it is possible for electrical contacts to be electrically connected to a lead frame in a subsequent bonding process.

In a further advantageous refinement of the method according to the invention, a depression that forms the cavity after the base body and the covering body have been joined together is formed in the covering body. By the method, simple forming of the cavity for receiving the micromechanical structure is possible.

In a further advantageous refinement of the method according to the invention, the depression that forms the cavity after the base body and the covering body have been joined together is formed in the base body. By this configuration it is possible for electrical contacts that are formed in the cavity to be exposed by the method according to the invention. It is particularly advantageous in this case that the covering body does not have to be structured. This allows costs to be saved in the production of the covering body.

In accordance with the invention, the base body is formed from silicon, gallium arsenide, ceramic or glass.

It is also advantageous that the covering body is joined together with the base body by eutectic bonding, silicon-fusion bonding, anodic bonding, adhesive bonding and/or soldering. These techniques are described, for example, in the reference titled "Micromechanik", by A. Heuberger, Springer-Verlag, 1991.

A further advantageous variant of the method according to the invention provides that the covering body is formed of silicon, of glass, of plastic, of a polymer or of a polyamide.

The prior art is restricted to the use of silicon as the covering body. The use of silicon wafers as covering bodies is relatively expensive here, with the result that the costs can be reduced if glass or plastics are used.

In a further advantageous refinement of the method according to the invention, the base body is laminated onto a film and the covering body is severed by sawing cuts. By this method it is possible to choose the depth of cut of the circular saw such that only the covering body is severed, in order to saw open any cavities and leave the base body unchanged. The sawing cuts are advantageously made in this case in such a way that no loose pieces, apart from the sawdust, are removed from the covering body, and consequently damage to structures on the base body or the saw blade is avoided.

In a further advantageous refinement of the method according to the invention, the composite body is laminated with the covering body onto a film and the composite body is sawn through by further sawing cuts, with individually separated chips being sawn out. The method allows the composite body to be detached from the film once the covering body has been saw into, and then subsequently laminated with the covering body onto the film. By this top-down configuration (the base body is located with its surface on which the micromechanical structures and the electrical contacts are disposed facing the film), the composite body can be sawn up and the "loose pieces" remain on the film.

A further method step then provides that the sawing depth of the circular saw is chosen such that the entire composite body, containing the base body and the covering body, is severed in a sawing cut, so that individually separated chips, which continue to remain adhering on the film, are sawn out.

In a further advantageous refinement of the method according to the invention, an individually separated chip is detached from the film by a vacuum pipette and the parts of the covering body that were disposed above the electrical contact remain on the film. By this method it is possible to detach the individually separated chips from the film, with the covers that were originally disposed over the electrical contacts continuing to remain adhering on the film.

In a further advantageous refinement of the method according to the invention, after the sawing-up of the composite body, a chip has electrical contacts on at least one side. Chips usually have a rectangular form, in this variant one side of the chip being provided with electrical contacts.

In a further advantageous refinement of the method according to the invention, after the sawing-up of the composite body, the chip has electrical contacts on one side and on at least one adjacent side. By this configuration it is possible to increase the number of electrical contacts and distribute them on two adjacent sides of a chip.

In a further advantageous refinement of the method according to the invention, after the sawing-up of the composite body, the chip has electrical contacts on one side and on a side lying opposite. By disposing the electrical contacts in this way, it is possible to increase their number. As a result, smaller chips, which have a greater number of contacts, are made possible. Likewise, the integration of more functionality on the chip is made possible, such as for example the integration of a microcontroller, thereby increasing the diversity of the product.

In a further advantageous refinement of the method according to the invention, after the sawing-up of the composite body, the chip has electrical contacts on at least three adjacent sides. This makes it possible to increase the number of electrical contacts still further.

Other features which are considered as characteristic for the invention are set forth in the appended claims.

Although the invention is illustrated and described herein as embodied in a method of producing micromechanical structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a sectional view of a second embodiment of the micromechanical structure according to the invention;

FIG. 5 is a sectional view of the micromechanical structure according to the invention from FIG. 4 at a later time in the process;

FIG. 6 is a sectional view of the micromechanical structure according to the invention from FIG. 5, the composite body having been separated into individual chips;

DESCRIPTION OF THE PREFERRED EMBODIMENTS

Figure 1:
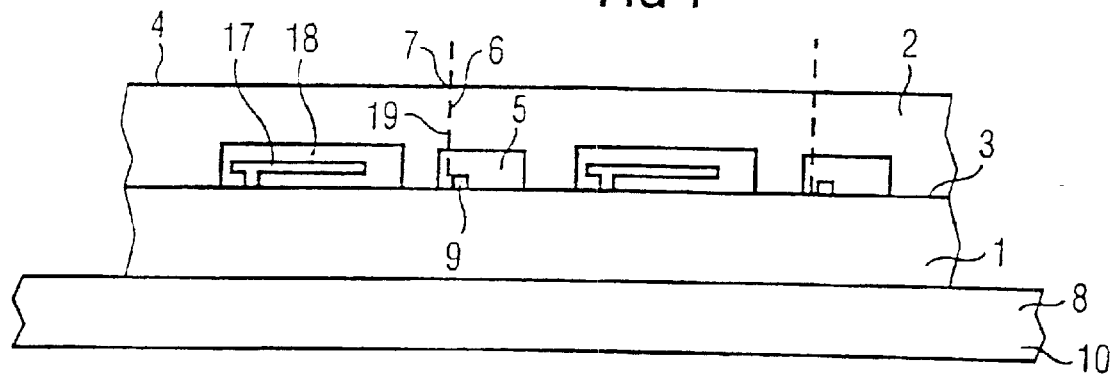
FIG. 1 is a diagrammatic, sectional view of an exemplary embodiment of a micromechanical structure according to the invention.

Referring now to the figures of the drawing in detail and first, particularly, to FIG. 1 thereof, there is shown a micromechanical structure according to the invention, which contains a base body 1 and is connected to a covering body 2 at a common boundary surface 3. Disposed on the base body 1 are a micromechanical structure 17 and an electrical contact 9. The base body 1 is for its part mounted on a support 8, which in this case contains a film 10. In this case, the composite body 4, which contains the base body 1 and the covering body 2, is consequently laminated onto the film 10. Disposed in the composite body 4 is a cavity 5, in which the electrical contact 9 is located. Also disposed in the composite body 4, along the common boundary surface 3, is a cavity 18, in which the micromechanical structure 17 is located. The covering body 2 is then sawn into along the dashed line 19 with a circular saw. As this takes place, the electrical contact 9 and the base body 1 remain largely intact.

Subsequently, the composite body 4 is detached from the support 8 and, with reference to FIG. 2, mounted with the covering body 2 on the support 8, in that the covering body 2 is laminated onto the film 10.

Figure 2:
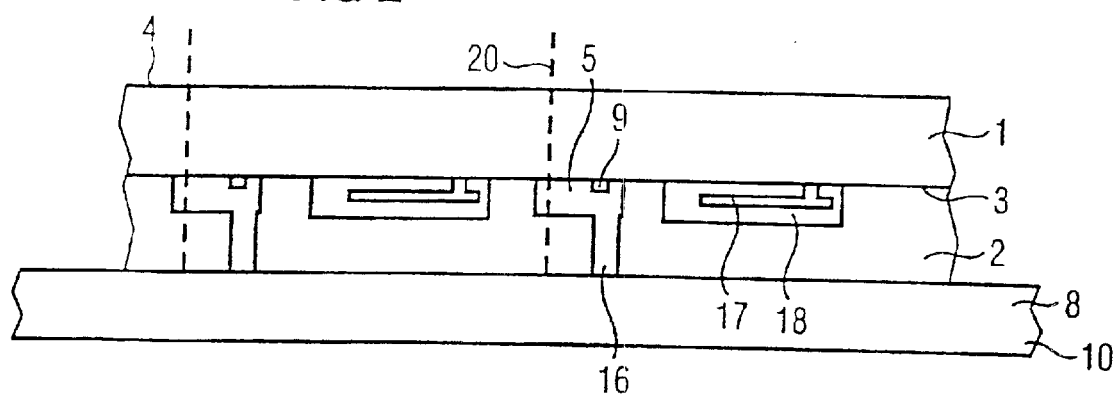
FIG. 2 is a sectional view of the exemplary embodiment of a micromechanical structure according to FIG. 1 at a later time in the process.
Figure 3:
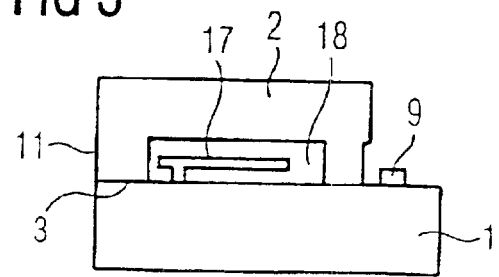
FIG. 3 is a sectional view of the exemplary embodiment according to FIG. 1, the composite body having been sawn up into individual chips.

An opening 16 that is produced by the sawing-in operation shown by the dashed line 19 on the covering body 2 can be clearly seen in FIG. 2. With a further sawing step along the dashed line 20, the composite body 4 is severed. As this takes place, the sawing proceeds in such a way that the cavity 5 is at least partially sawn through, so that the individually separated chip 11 represented in FIG. 3 is produced.

The first sawing operation along the dashed line 19 is carried out in such a way that no fragments which could destroy the saw blade are cut out from the covering body 2. The sawing-through operation along the dashed line 20 is carried out in such a way that the depth of cut is adequate to sever the composite body 4 as a whole, but the support 8 retains its function as a supporting material, and is not severed.

With reference to FIG. 4, a second exemplary embodiment of the invention is shown. The difference from FIG. 1 is that the covering body 2 is largely unstructured and the cavity 5 with the electrical contact 9 located in it and also the further cavity 18 with the micromechanical structure 17 located in it are formed in the base body 1 instead of the covering body 2. The advantage of the variant of the invention represented in FIG. 4 is that an unstructured covering body 2 can be used. Here, too, the covering body 2 is sawn into on an outwardly facing surface 7, so that the material 6 is removed and the opening 16 is formed.

Subsequently, the composite body 4 is detached from the support 8 and, with reference to FIG. 5, laminated with the covering body 2 onto the support 8, which in this case contains the film 10. With reference to FIG. 5, the composite body 4 is sawn through along the dashed line 20, thereby producing an individually separated chip 11.

Represented in FIG. 6 is the individually separated chip 11 containing the base body 1 and the covering body 2, which are connected at the common boundary surface 3. Also located in the cavity 18, which is disposed between the base body 1 and the covering body 2, is the micromechanical structure 17.

Figure 7A:
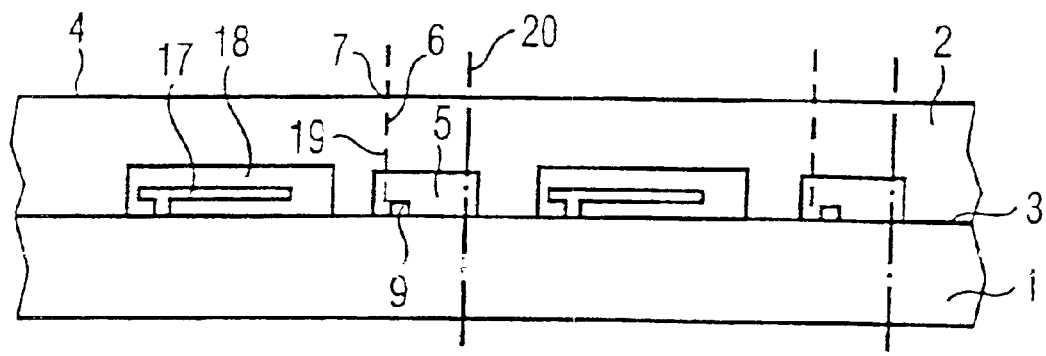
FIG. 7A is a cross-sectional view through the micromechanical structure according to the invention.
Figure 7B:
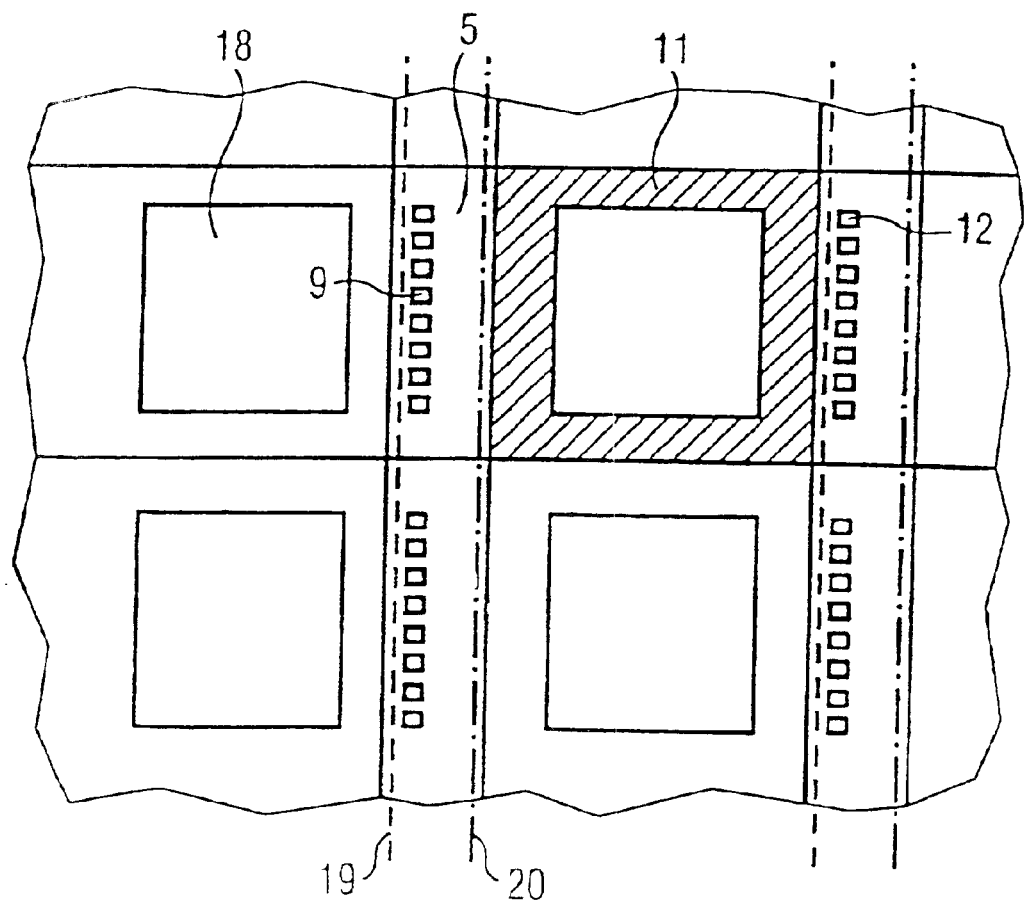
FIG. 7B is a plan view of the micromechanical structure according to the invention from FIG. 7a, for forming a chip with electrical contacts on one side of the chip.

With reference to FIG. 7A and FIG. 7B, a sawing method is described, with which the individually separated chips 11 which have the electrical contacts 9 on one side can be sawn out from the composite body 4. Represented in FIG. 7B is the plan view of the composite body 4. The individually separated chip 11 that is later produced is shown with a shaded background. In the composite body there is the cavity 5, which is opened by the sawing-in operation along the dashed line 19 on the covering body 2. With the sawing-through operation along the dashed line 20, the composite body 4 is divided up into individual chips 11. After the sawing-up into individual chips, electrical contacts 12 are located on one side of the chip 11.

Figure 8A:
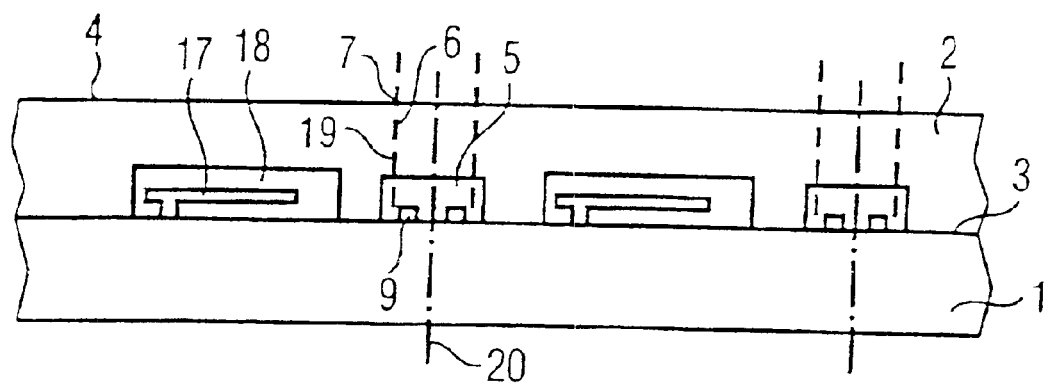
FIG. 8A is a cross-sectional view through a further micromechanical structure according to the invention.
Figure 8B:
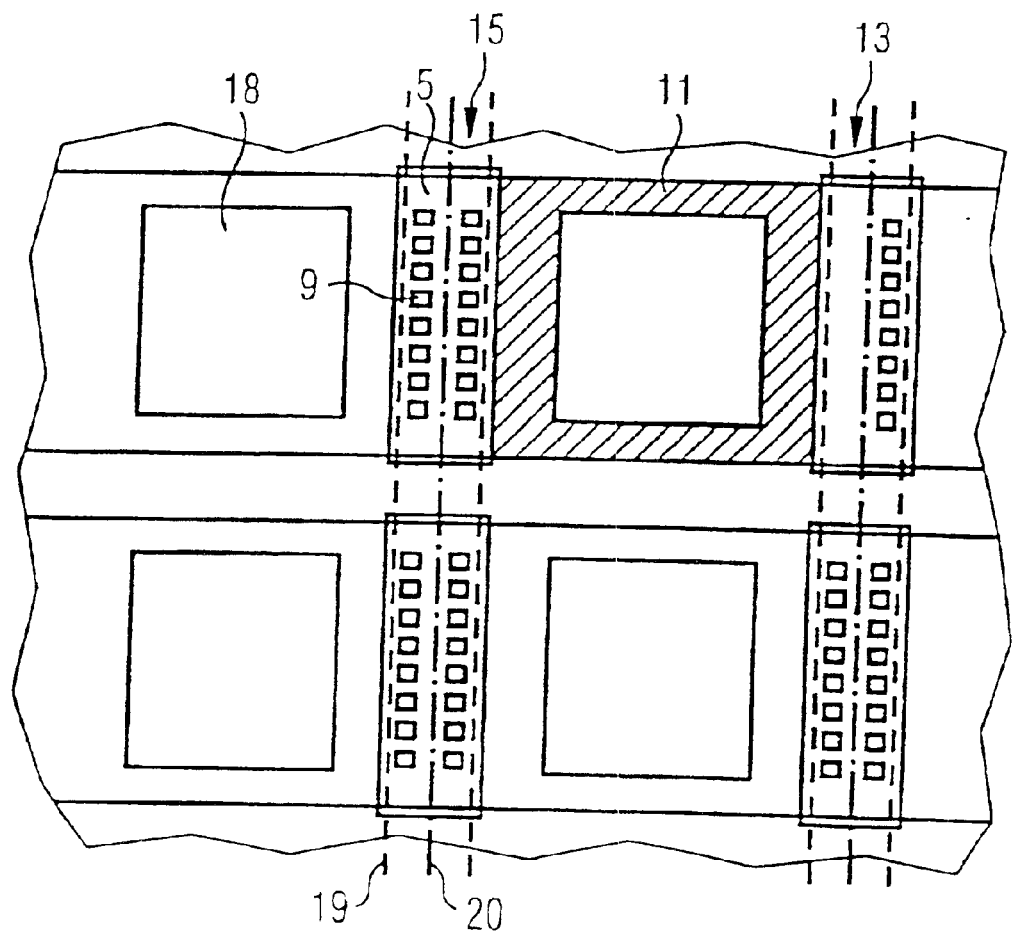
FIG. 8B is a plan view of the further micromechanical structure represented in FIG. 8A, the electrical contacts being disposed in such a way that, when the composite body is cut up, individual chips which have electrical contacts on two opposite sides are produced.

With reference to FIG. 8A and FIG. 8B, a sawing method for producing individual chips on which the electrical contacts are disposed on a side 13 and on a side 15 lying opposite is described.

With reference to FIG. 8B, two rows of electrical contacts 9 are disposed in the cavity 5. The cavity 5 is opened by a sawing-in operation along the dashed line 19 on the covering body 2. Subsequently, the composite body 4 is laminated with the covering body 2 onto the film 10 and the composite body 4 is divided up into individually separated chips by the sawing-through operation along the dashed line 20.

Figure 9A:
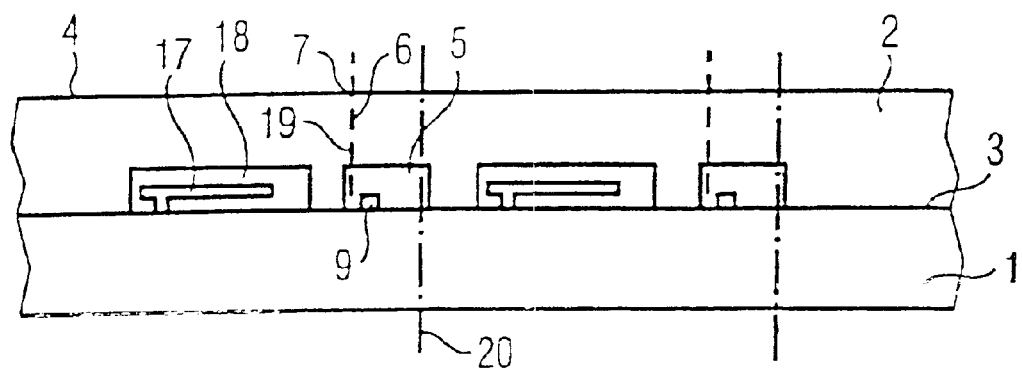
FIG. 9A is a cross-sectional view through another micromechanical structure.
Figure 9B:
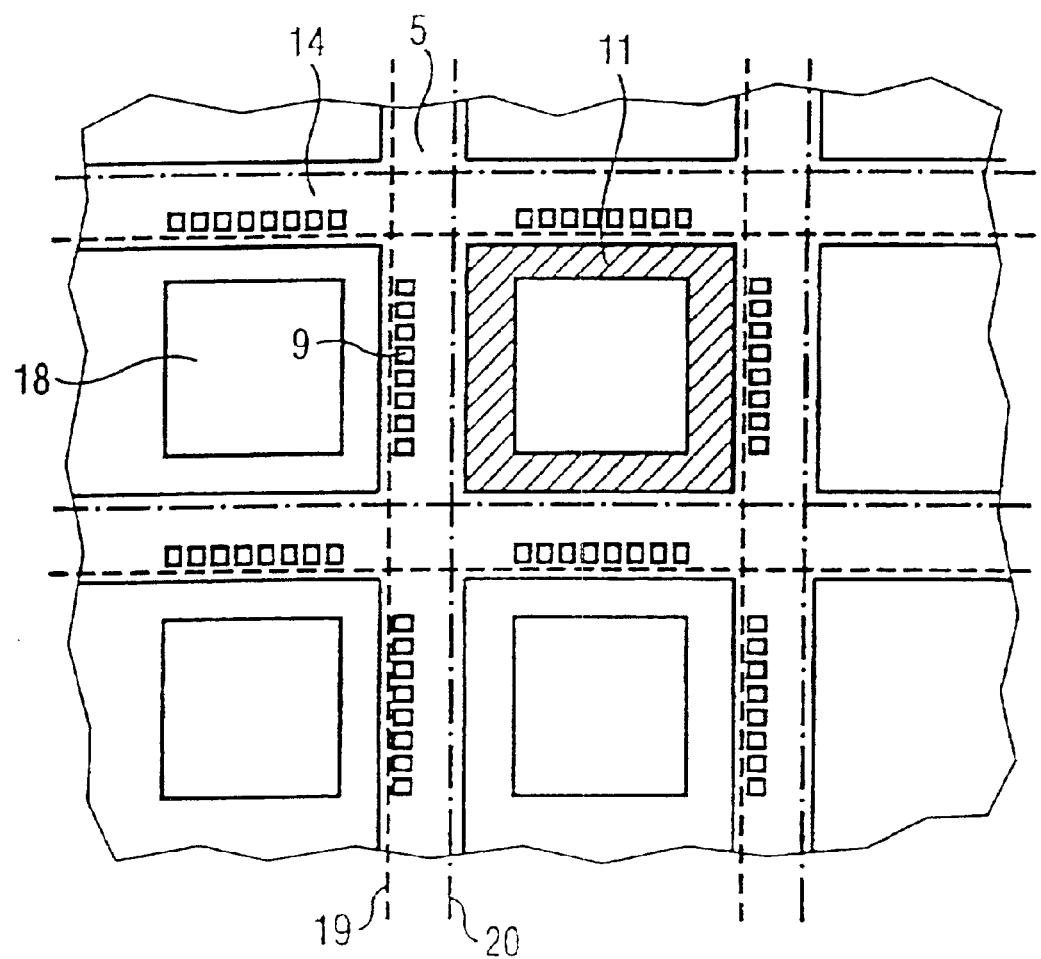
FIG. 9B is a plan view of the micromechanical structure represented in FIG. 9A, the electrical contacts being disposed in such a way that, after the cutting-up, the chips have electrical contacts on two adjacent sides.

With reference to FIG. 9A and FIG. 9B, a further exemplary embodiment of the sawing of the composite body 4 is represented.

With reference to FIG. 9B, the electrical contacts 9 are disposed on two sides of the chip. First, the cavity 5 is opened by the sawing-in operation along the dashed line 19, subsequently the covering body 2 is laminated onto the film 10 and the composite body 4, containing the base body 1 and the covering body 2, is sawn up as a whole. During the sawing-up, individually separated chips 11 that have the electrical contacts 9 on two adjacent sides are produced.

Figure 10A:
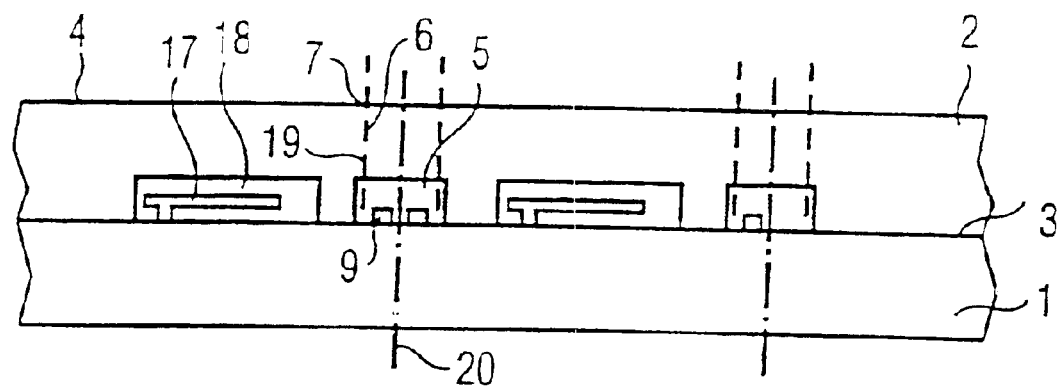
FIG. 10A is a cross-sectional view of yet another micromechanical structure according to the invention.
Figure 10B:
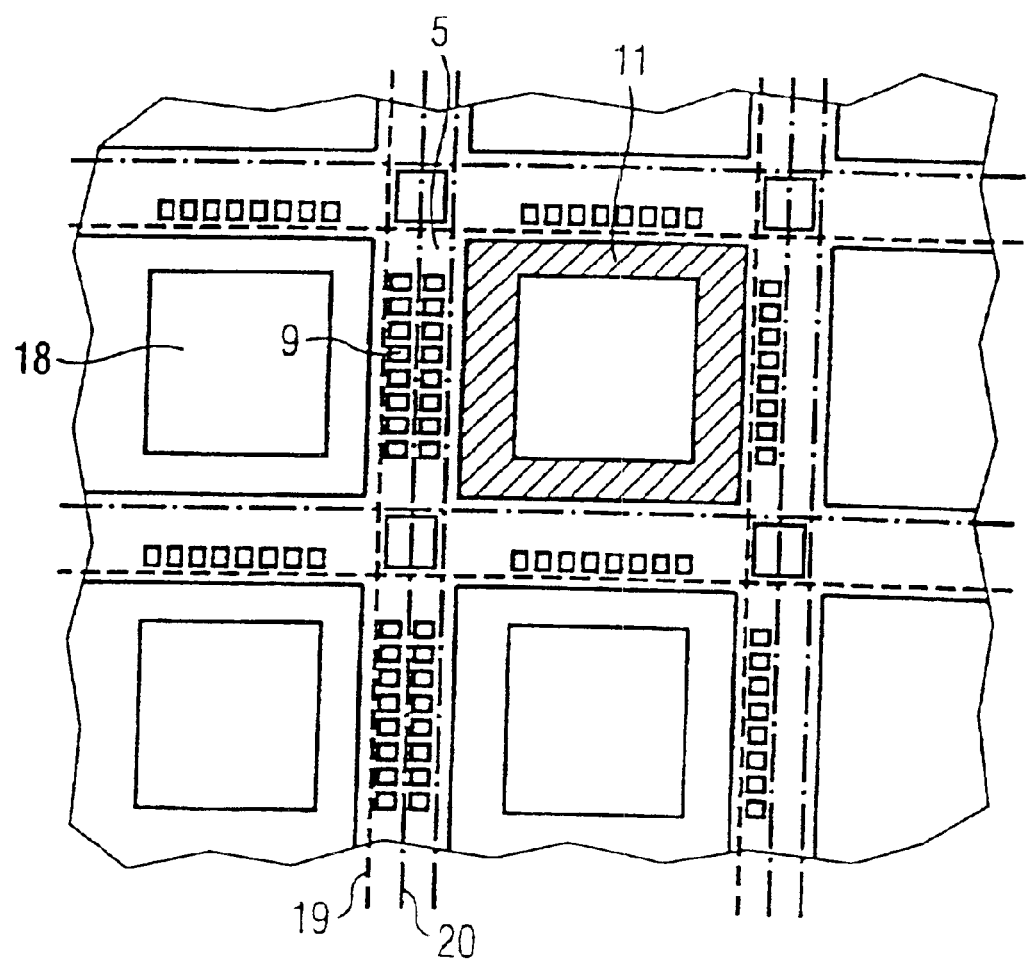
FIG. 10B is a plan view of the micromechanical structure represented in FIG. 10A, the electrical contacts being disposed in such a way that, after the cutting-up, each chip has electrical contacts on three adjacent sides.

With reference to FIG. 10A and FIG. 10B, a production method for individually separated chips that have electrical contacts on three adjacent sides is described.

Two rows of the electrical contacts 9 are disposed on the base body 1. Subsequently, the covering body 2 is connected to the base body 1, so that the electrical contacts 9 are disposed in the cavity 5. The cavity 5 is opened by a sawing-in operation along the dashed line 19 on the covering body 2. Subsequently, the composite body 4 is laminated with the covering body 2 onto the film 10. With the sawing-through operation along the dashed line 20, the composite body 4 is sawn up into individually separated chips 11.

By the two-sided sawing of the composite body 4 with different sawing depths, used in the method described above, the electrical contacts 9 can be exposed without pieces of the covering wafer becoming detached and being swept away in the flushing operation accompanying sawing. The electrical contacts 9 are in this case disposed in cavities that are opened in a first sawing step, in that the covering body 2 is sawn into. In the case of the first sawing process, the composite body 4 is laminated with the base body 1 onto the film 10. The sawing depth is to be chosen in this case such that only the covering body 2 is severed and the structures on the base body 1 are preserved. The sawing lines are disposed here in such a way that they form a tangent to certain parts of the cavity 5, but no "loose parts" are sawn out from the covering body 2. Therefore, the supports to which the sawn parts of the covering body 2 initially remain attached are preserved.

After the first sawing step, the composite body 4 is removed from the film 10 and laminated with the covering body 2 once again onto the film 10. In a second sawing step, the composite body 4, which contains the base body 1 and the covering body 2, is completely severed. After the second sawing step, individually separated chips are produced, which adhere on the film 10. These can then be detached from the sawing film 10 by standard methods. The parts of the covering body 2 that lay over the electrical contacts remain adhering on the sawing film.

We claim:

1. A method of producing a micromechanical structure, which comprises the steps of:
    joining a base body to a covering body along a common boundary surface to form a composite body having a cavity formed in the composite body along the common boundary surface;
    disposing the composite body with a surface of the base body on a support for a sawing of the covering body;
    forming an opening to the cavity by removing material in a region of one surface of the composite body; and
    disposing the composite body with a surface of the covering body on the support for a sawing of the base body.

2. The method according to claim 1, which comprises forming the opening to the cavity by at least partially sawing the material in the region of the one surface of the composite body using a circular saw.

3. The method according to claim 2, which comprises providing an electrical contact in the cavity and the electrical contact is at least partially exposed during the sawing.

4. The method according to claim 3, which comprises laminating the base body onto a film functioning as the support and severing the covering body with the sawing.

5. The method according to claim 3, which comprises laminating the composite body having the covering body onto a film functioning as the support and performing further sawing cuts through the composite body, with an individually separated chip being sawn out.

6. The method according to claim 5, which comprises detaching the individually separated chip from the film by a vacuum pipette and parts of the covering body that were disposed above the electrical contact remain on the film.

7. The method according to claim 5, which comprises providing a plurality of electrical contacts in the cavity and after a sawing-up of the composite body, the individually separated chip has the electrical contacts on at least one side.

8. The method according to claim 5, which comprises providing a plurality of electrical contacts in the cavity, and after a sawing-up of the composite body, the individually separated chip has the electrical contacts on a first side and at least one second side adjacent to the first side.

9. The method according to claim 5, which comprises providing a plurality of electrical contacts in the cavity, and after a sawing-up of the composite body, the individually separated chip has the electrical contacts on a first side and a second side lying opposite the first side.

10. The method according to claim 1, which comprises forming a depression in the covering body, the depression forms the cavity after the base body and the covering body have been joined together.

11. The method according to claim 1, which comprises forming a depression in the base body, the depression forms the cavity after the base body and the covering body have been joined together.

12. The method according to claim 1, which comprises forming the base body from a material selected from the group consisting of silicon, gallium arsenide, ceramic and glass.

13. The method according to claim 1, which comprises using at least one method selected from the group consisting of a eutectic bonding method, a silicon-fusion bonding method, an anodic bonding method, an adhesive bonding method, and a soldering method for joining the covering body to the base body.

14. The method according to claim 1, which comprises forming the covering body from a material selected from the group consisting of silicon, glass and plastic.

* * * * *